United States Patent
Qin

(10) Patent No.: US 8,842,252 B2
(45) Date of Patent: Sep. 23, 2014

(54) ARRAY SUBSTRATE, LCD DEVICE, AND METHOD FOR MANUFACTURING ARRAY SUBSTRATE

(75) Inventor: Shijian Qin, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 149 days.

(21) Appl. No.: 13/580,408

(22) PCT Filed: Jul. 12, 2012

(86) PCT No.: PCT/CN2012/078575
§ 371 (c)(1),
(2), (4) Date: Aug. 22, 2012

(87) PCT Pub. No.: WO2014/005349
PCT Pub. Date: Jan. 9, 2014

(65) Prior Publication Data
US 2014/0002763 A1     Jan. 2, 2014

(30) Foreign Application Priority Data

Jul. 2, 2012  (CN) .......................... 2012 1 0223787

(51) Int. Cl.
*G02F 1/1333*  (2006.01)
*G02F 1/1343*  (2006.01)
*G02F 1/136*   (2006.01)

(52) U.S. Cl.
USPC ............... 349/158; 349/38; 349/39; 349/42; 349/43

(58) Field of Classification Search
USPC .................. 349/158, 43, 42, 38, 39
See application file for complete search history.

(56) References Cited

U.S. PATENT DOCUMENTS

| | | | | |
|---|---|---|---|---|
| 5,907,008 A | * | 5/1999 | Nakano et al. | 524/430 |
| 6,469,769 B2 | * | 10/2002 | Ozaki | 349/187 |
| 6,771,346 B2 | * | 8/2004 | Sugimoto et al. | 349/149 |
| 6,881,529 B2 | * | 4/2005 | Iwasaki | 430/166 |
| 2009/0108264 A1 | | 4/2009 | Inoue et al. | |
| 2011/0122330 A1 | | 5/2011 | Tae et al. | |

FOREIGN PATENT DOCUMENTS

| | | | | |
|---|---|---|---|---|
| CN | 1445583 A | | 10/2003 | |
| CN | 1797151 A | | 7/2006 | |
| CN | 101097375 A | * | 1/2008 | ............ G02F 1/1362 |
| CN | 101304033 A | | 11/2008 | |
| CN | 102306650 A | | 1/2012 | |
| CN | 102385196 A | | 3/2012 | |

OTHER PUBLICATIONS

Zhong Yanxin, the International Searching Authority written comments, Apr. 2013, CN.

* cited by examiner

*Primary Examiner* — Mike Qi
(74) *Attorney, Agent, or Firm* — Na Xu; IPro, Inc.

(57) ABSTRACT

An array substrate includes a storage electrode layer; an insulating layer and a transparent electrode layer are coated on a surface of the storage electrode layer in sequence. Only the insulating layer is arranged between the storage electrode layer and the transparent electrode layer of the present disclosure.

5 Claims, 4 Drawing Sheets

ARRAY SUBSTRATE, LCD DEVICE, AND METHOD FOR MANUFACTURING ARRAY SUBSTRATE

This application is a national stage application of PCT application PCT/CN2012/078575 filed on Jul. 12, 2012, which is based on and claims priority to Chinese patent application 201210223797.2 filed on Jul. 2, 2012 in China. The entirety of each of the above-mentioned applications is hereby incorporated by reference herein in its entirety.

TECHNICAL FIELD

The present disclosure relates to the field of liquid crystal displays (LCDs), and more particularly to an array substrate, an LCD device, and a method for manufacturing the array substrate.

BACKGROUND

A liquid crystal display (LCD) device includes a backlight module and an LCD panel. The LCD panel includes an array substrate and a color film (CF) substrate which are mutually and oppositely arranged. For an LCD panel of a thin film transistor (TFT) structure, the array substrate is provided with a plurality of TFTs (as shown in FIG. 1), a plurality of transparent electrode layers, and a plurality of scan lines and data lines which are crisscross arranged. Each TFT includes a gate electrode connected with a scan line, a source electrode connected with a data line, and a drain electrode connected with a transparent electrode layer. To ensure that the TFT can keep the deflection of liquid crystal (LC) molecules in one scanning period, a storage electrode layer is generally arranged under the transparent electrode layer. A storage capacitor is formed between the transparent electrode layer and the storage electrode layer, which can store charges when the TFT is switched on and supply electric quantity when the TFT is switched off until being switched on for the next time, so as to keep the deflection of the LC molecules. In typical storage capacitors, nonmetal layers such as an insulating layer, a protective layer, etc. are arranged between the storage electrode layer and the transparent electrode layer. The storage capacitor is small, thereby being unfavorable to electric quantity storage.

SUMMARY

In view of the above-described problems, the aim of the present disclosure is to provide an array substrate, a liquid crystal display (LCD) device, and a method for manufacturing the array substrate with large storage capacitor.

The aim of the present disclosure is achieved by the following technical scheme.

An array substrate comprises a storage electrode layer; and an insulating layer and a transparent electrode layer are coated on a surface of the storage electrode layer in sequence.

In one example, the array substrate comprises a gate electrode layer arranged in parallel with the storage electrode layer. The insulating layer and an active layer are coated on the gate electrode layer in sequence, an active electrode layer and a drain electrode layer are coated on the active layer, and one end of the drain electrode layer is electrically connected with one end of the transparent electrode layer. This is a specific matching structure of the drain electrode layer and the transparent electrode layer. The drain electrode layer is positioned above the transparent electrode layer, and the two are overlapped at the edges to form electric connection.

In one example, the active layer comprises an a-Si layer and an n+a-Si layer which are coated on the insulating layer in sequence. The active electrode layer and the drain electrode layer are coated on the n+a-Si layer, and a conducting channel is arranged between the source electrode layer and the drain electrode layer. The conducting channel penetrates through the n+a-Si layer. A protective layer is coated on the surface of the source electrode layer, the drain electrode layer, the conducting channel, and the transparent electrode layer. This is a specific thin film transistor (TFT) structure.

In one example, the transparent electrode layer is made of indium tin oxide (ITO). This is a specific material of the transparent electrode layer.

An LCD device comprises the array substrate mentioned above.

A method for manufacturing an array substrate comprises the following steps:

A: Forming a gate electrode layer and a storage electrode layer of a TFT on a glass substrate, and coating an insulating layer on the gate electrode layer and the storage electrode layer;

B: Forming a transparent electrode layer on an area of the insulating layer corresponding to the storage electrode layer; and C: Manufacturing a source electrode layer, a drain electrode layer, and a conducting channel of the TFT.

In one example, the step B comprises the following steps:

B1: Coating an a-Si layer and an n+a-Si layer on the insulating layer in sequence;

B2: Coating a photoresist on the n+a-Si layer, and removing the photoresist of an area corresponding to the storage electrode layer by exposure and development;

B3: Etching the a-Si layer and the n+a-Si layer of the area corresponding to the storage electrode layer; and B4: Coating a transparent conducting material on a surface of an area of the insulating layer corresponding to the photoresist and the storage electrode layer, stripping residual photoresist and transparent conducting material of the photoresist surface, and forming the transparent electrode layer on the insulating layer corresponding to the storage electrode layer by residual transparent conductive material.

By using the technical scheme, the transparent electrode layer is manufactured without using the methods of exposure and development. The transparent conducting material of the surface is automatically stripped when stripping the photoresist by using the residual photoresist of the former process as a shelter, and the required transparent electrode layer is automatically formed by the residual transparent conducting material. Thus, one mask process is saved; therefore, the production efficiency is increased, and the manufacturing cost is reduced.

In one example, the step B comprises the following steps:

B1: Coating a transparent conducting material on the insulating layer;

B2: Coating a photoresist on the transparent conductive material, and forming a transparent electrode pattern by exposure and development;

B3: Etching transparent conducting material outside the transparent electrode pattern;

B4: Coating an a-Si layer and an n+a-Si layer on surfaces of the transparent electrode pattern and the insulating layer in sequence; and B5: Stripping residual photoresist, and forming the transparent electrode layer by exposed transparent conductive material.

This is another method for manufacturing the transparent electrode layer. The transparent electrode layer is formed by exposure and development, the a-Si layer and the n+a-Si layer of the TFT are directly formed by using the residual photoresist as a shelter, and the single mask process of the a-Si layer and the n+a-Si layer is saved; thus, the production efficiency is increased, and the manufacturing cost is reduced.

In one example, the step C comprises the following steps:

C1: Coating a metal conducting layer on the surface of the array substrate to cover the transparent electrode layer and the n+a-Si layer;

C2: Coating the photoresist on the surface of the metal conducting layer, forming a source electrode pattern and a drain electrode pattern of the TFT by exposure and development, and covering one end of the transparent electrode layer by the drain electrode pattern;

C3: Etching the metal conducting layer to form the source electrode layer and the drain electrode layer of the TFT;

C4: Completely etching exposed n+a-Si layer material between the source electrode layer and the drain electrode layer to form the conducting channel; and C5: Coating a protective layer on the surface of the source electrode layer, the drain electrode layer, the conducting channel, and the transparent electrode layer.

This is a specific method for manufacturing the source electrode layer and the drain electrode layer. Because the drain electrode pattern covers one end of the transparent electrode layer, after stripping the drain electrode pattern in sequence, the formed drain electrode layer is automatically overlapped with the transparent electrode layer, to form electric connection.

In one example, the transparent electrode layer is made of ITO. This is a specific material of the transparent electrode layer.

The present disclosure provides an array substrate, an LCD device, and a method for manufacturing the array substrate. Only the insulating layer is arranged between the storage electrode layer and the transparent electrode layer. Compared with the structures between which multilayer metal layers including an insulating layer, a protective layer and the like are arranged, the capacity of the storage capacitor is increased.

DETAILED DESCRIPTION

The present disclosure provides a liquid crystal display (LCD) device, comprising a backlight module and an LCD panel. The LCD panel comprises an array substrate and a color film (CF) substrate which are mutually and oppositely arranged. The array substrate of the present disclosure is provided with a plurality of thin film transistors (TFTs), a plurality of transparent electrode layers, and a plurality of scan lines and data lines which are crisscross arranged. Each TFT comprises a gate electrode layer connected with a scan line, a source electrode layer connected with a data line, and a drain electrode layer connected with a transparent electrode layer. The array substrate further comprises a storage electrode layer; an insulating layer and a transparent electrode layer are coated on the surface of the storage electrode layer in sequence.

Figure 1:
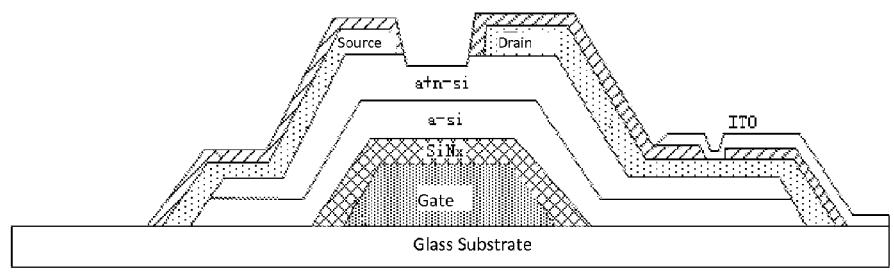
FIG. 1 is a structure diagram of a typical array substrate.
Figure 2:
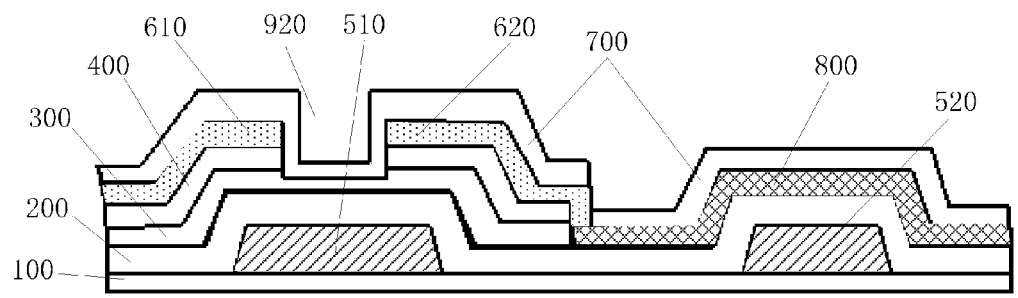
FIG. 2 is a structure diagram of an array substrate of the present disclosure.

As shown in FIG. 2, both the storage electrode layer 520 and the gate electrode layer 510 of the array substrate are arranged on a glass substrate 100. An insulating layer 200, an a-Si layer 300, and an n+a-Si layer 400 are coated on the gate electrode layer 510 in sequence. A source electrode layer 610 and a drain electrode layer 620 are coated on the n+a-Si layer 400, and a conducting channel 920 is arranged between the source electrode layer 610 and the drain electrode layer 620. The conducting channel 920 penetrates through the n+a-Si layer 400. The insulating layer 200 and the transparent electrode layer 800 are coated on the storage electrode layer 520, and the drain electrode layer 620 is coated above the transparent electrode layer 800 and is overlapped with one end of the transparent electrode layer 800, to form electric connection. A protective layer 700 is coated on the surface of the source electrode layer 610, the drain electrode layer 620, the conducting channel 920, and the transparent electrode layer 800. The transparent electrode layer 800 can be made of transparent conducting material such as indium tin oxide (ITO), etc.

Only the insulating layer 200 is arranged between the storage electrode layer 520 and the transparent electrode layer 800 of the present disclosure. Compared with the structures of multilayer nonmetal media, the capacity of the storage capacitor is increased. A method for manufacturing the array substrate of the present disclosure will be further described in accordance with the Figures and exemplary examples.

EXAMPLE 1

Figure 3:
FIG. 3 is an effect diagram of a step a of an example of the present disclosure.
Figure 4:
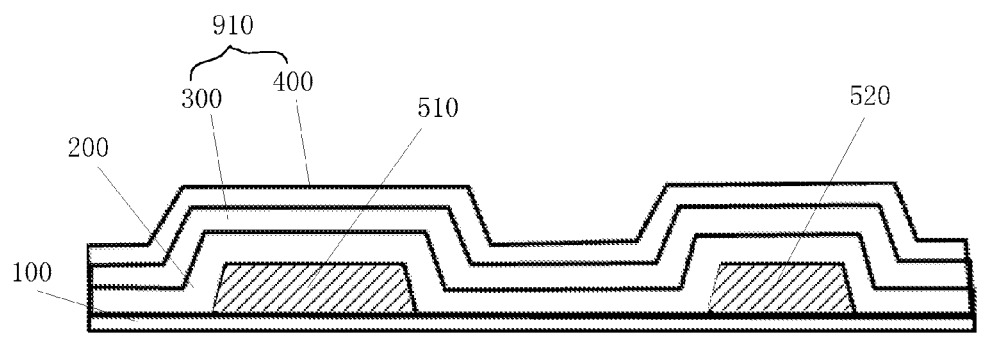
FIG. 4 is an effect diagram of a step b of an example of the present disclosure.
Figure 5:
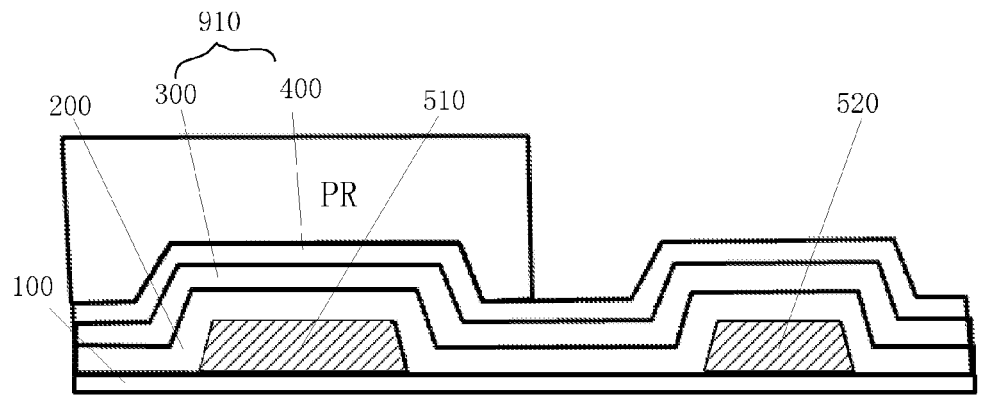
FIG. 5 is an effect diagram of a step c of an example of the present disclosure.
Figure 6:
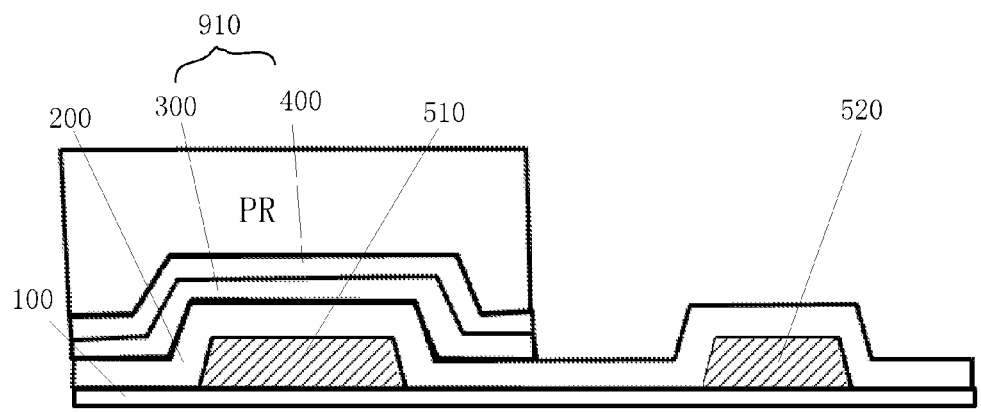
FIG. 6 is an effect diagram of a step d of an example of the present disclosure.
Figure 7:
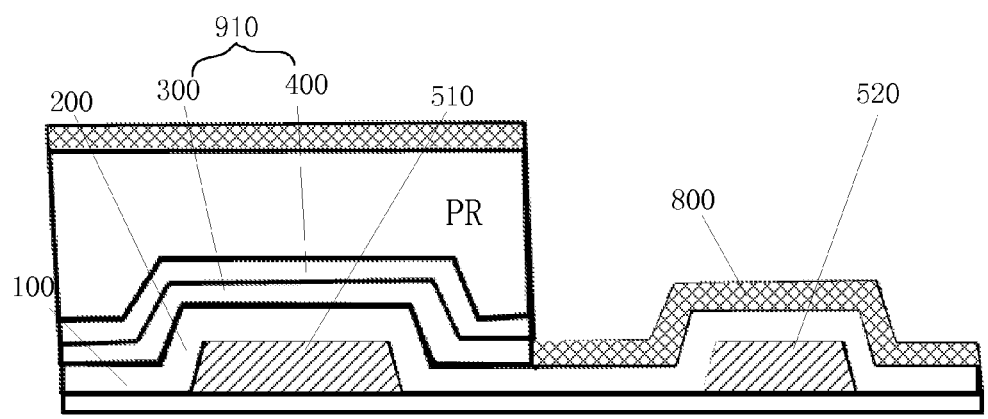
FIG. 7 is an effect diagram of sputter coating a transparent electrode layer of a step e of an example of the present disclosure.
Figure 8:
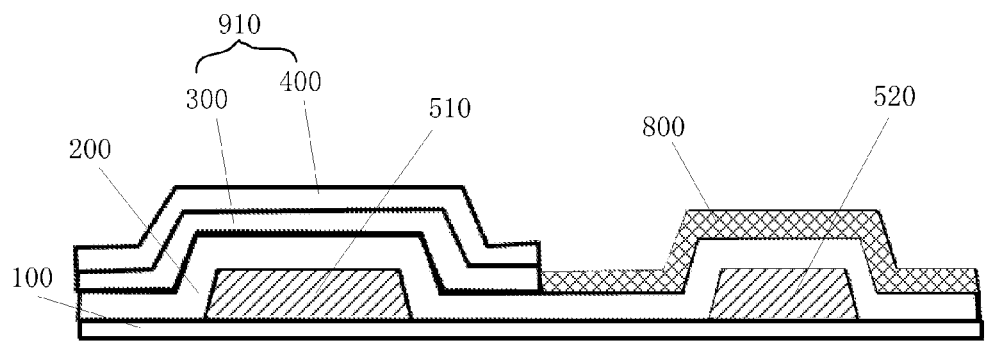
Figure 9:
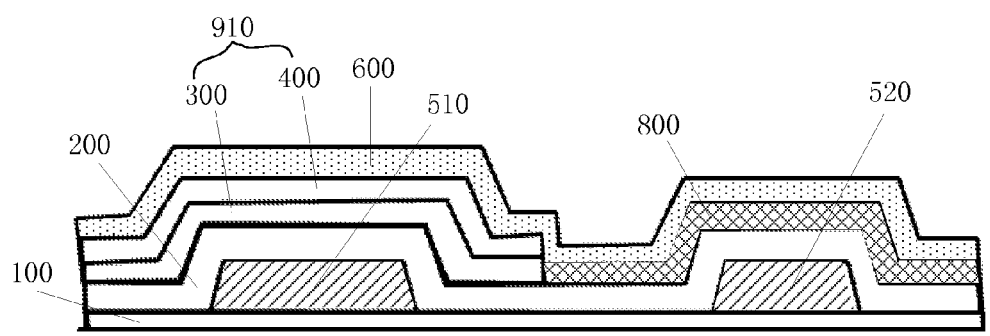
FIG. 9 is an effect diagram of a step f of an example of the present disclosure.
Figure 10:
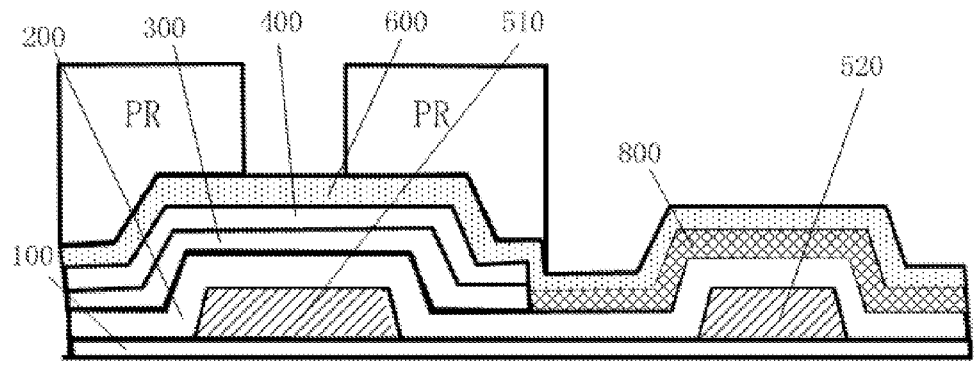
FIG. 10 is an effect diagram of a step g of an example of the present disclosure.
Figure 11:
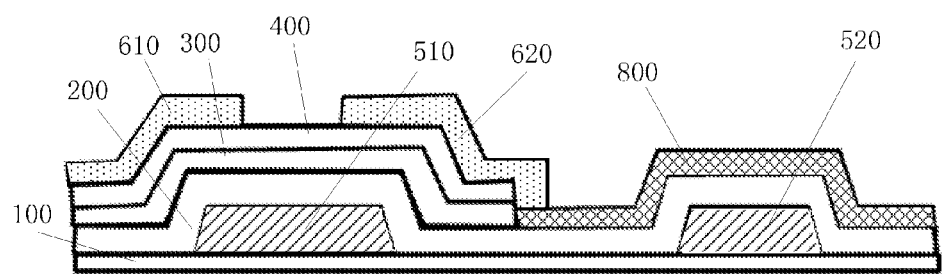
FIG. 11 is an effect diagram of a step h of an example of the present disclosure.
Figure 12:
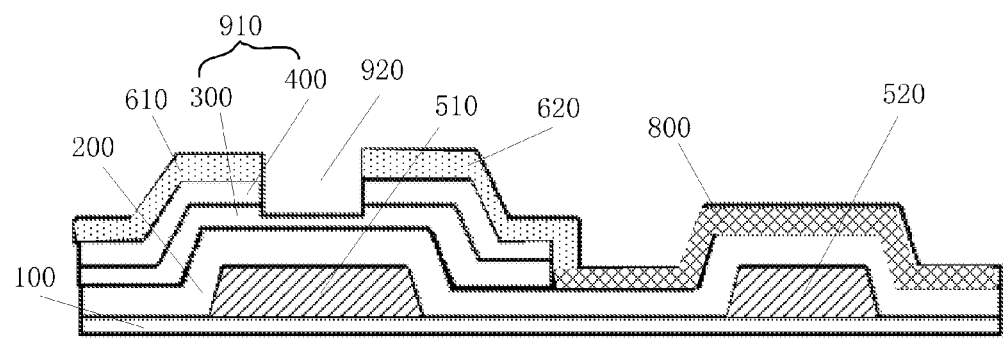
FIG. 12 is an effect diagram of a step i of an example of the present disclosure.

This is an optimal example of the present disclosure, comprising the following steps:

a: As shown in FIG. 3, depositing a metal layer on the glass substrate 100 by sputter coating, and manufacturing the gate electrode layer 510 and the storage electrode layer 520 by imaging method of gluing, exposure, and development; the sputter coated metal layer is made of high-conductivity metal such as Al, Cu, Ag, Mo, Cr, Ti and the like, and both the gate electrode layer 510 and the storage electrode layer 520 are formed with corresponding patterns by wet etching;

b: As shown in FIG. 4, depositing the insulating layer 200 and the storage electrode layer 910 (a-Si layer 300 and n+a-Si layer 400 in order) on the gate electrode layer 510 and the storage electrode layer 520 by chemical vapor deposition (CVD) in sequence;

c: As shown in FIG. 5, coating a photoresist (see PR shown in FIG. 5) on the surface of the active layer 910 (namely n+a-Si layer 400), and removing the photoresist of the area corresponding to the storage electrode layer 520 by exposure and development;

d: Removing the active layer 910 of the area corresponding to the storage electrode layer 520 by dry plasma etching (main gas for etching is a F compound gas), and keeping the insulating layer 200 (see FIG. 6);

e: Depositing the transparent electrode layer 800 (made of ITO, IZO, and the like), automatically removing the transparent electrode layer 800 above the active layer 910 of the TFT after stripping the photoresist, and keeping the transparent electrode layer 800 above the area of the storage electrode layer 520 and at the TFT pixel (see FIG. 7 and FIG. 8);

f: Coating the metal conducting layer 600 by sputter coating, covering the transparent electrode layer 800 and the active layer 910 of the TFT (made of high-conductivity metal such as Al, Cu, Ag, Mo, Cr, Ti, etc.) (See FIG. 9);

g: As shown in FIG. 10, coating the photoresist on the surface of the metal conducting layer 600 (see PR shown in FIG. 9), forming the source electrode and drain electrode patterns of the TFT by exposure and development, and covering one end of the transparent electrode layer 800 by the drain electrode pattern;

h: Treating the metal conducting layer 600 by wet etching to form the source electrode layer 610 and the drain electrode layer 620 of the TFT (see FIG. 11);

i: Cutting the n+a-Si layer 400 of the active layer 910 by dry etching to form the conducting channel 920 (see FIG. 12); and j: Depositing a protective layer 700 (passivation) by CVD, covering the source electrode layer 610, the drain electrode layer 620, the conducting channel 920, and the transparent electrode layer 800 (see FIG. 2).

By using the technical scheme, the transparent electrode layer is manufactured without using the methods of exposure and development. The transparent conducting material of the photoresist surface is automatically stripped when stripping the photoresist by using the residual photoresist of the former process as a shelter, and the required transparent electrode layer is automatically formed by the residual transparent conducting material. Thus, one mask process is saved, and the array substrate is manufactured by using only three mask processes. Thus, the production efficiency is increased, and the manufacturing cost is reduced. Optionally, partial structures of the TFTs of the present disclosure can be manufactured as taught in the prior art.

EXAMPLE 2

A method for manufacturing the array substrate comprises the following steps:

a: Directly depositing the transparent electrode layer 800 (made of similar material such as ITO, IZO, etc.) on the insulating layer 200 by sputter coating;

b: Coating a photoresist on the transparent conductive material, and forming a transparent electrode pattern above the area of the storage electrode layer 520 and at the TFT pixel by exposure and development;

c: Etching the transparent conducting material outside the transparent electrode pattern;

d: Coating the active layer 910 (coating the a-Si layer 300 and the n+a-Si layer 400 in sequence) on the surface of the transparent electrode pattern arranged above the area of the storage electrode layer 520 and at the TFT pixel and the insulating layer 200 in sequence;

e: Stripping residual photoresist, and forming the transparent electrode layer 800 by the exposed transparent conductive material;

f: Coating the metal conducting layer 600 by sputter coating, and covering the transparent electrode layer 800 and the active layer 910 of the TFT (made of high-conductivity metal such as Al, Cu, Ag, Mo, Cr, Ti, etc.);

g: Coating the photoresist on the surface of the metal conducting layer 600, forming the source electrode and drain electrode pattern of the TFT by exposure and development, and covering one end of the transparent electrode layer 800 by the drain electrode pattern;

h: Treating the metal conducting layer 600 by wet etching to form the source electrode layer 610 and the drain electrode layer 620 of the TFT;

i: Cutting the n+a-Si layer 400 of the active layer 910 by dry etching to form the conducting channel 920; and j: Depositing a protective layer 700 (passivation) by CVD, and covering the source electrode layer 610, the drain electrode layer 620, the conducting channel 920, and the transparent electrode layer 800.

This is another method for manufacturing the array substrate of the present disclosure. The transparent electrode layer is formed by exposure and development, the active layer 910 (a-Si layer and the n+a-Si layer) of the TFT is directly formed by using the residual photoresist as a shelter, and the single mask process of the a-Si layer and the n+a-Si layer is saved. Thus, the production efficiency is increased, and the manufacturing cost is reduced. Optionally, partial structures of the TFTs of the present disclosure can be manufactured as taught in the prior art.

The present disclosure is described in detail in accordance with the above contents with the specific exemplary examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

I claim:

1. A method for manufacturing an array substrate, comprising: the following steps:

A: Forming a gate electrode layer and a storage electrode layer of a thin film transistor (TFT) on a glass substrate, and coating an insulating layer on the gate electrode layer and the storage electrode layer;

B1: Coating an a-Si layer and an n+a-Si layer on the insulating layer in sequence;

B2: Coating a photoresist on the n+a-Si layer, and removing the photoresist of an area corresponding to the storage electrode layer by exposure and development;

B3: Etching the a-Si layer and the n+a-Si layer of the area corresponding to the storage electrode layer; and B4: Coating a transparent conducting material on a surface of an area of the insulating layer corresponding to the photoresist and the storage electrode layer, stripping residual photoresist and transparent conducting material of the photoresist surface, and forming the transparent electrode layer on the insulating layer corresponding to the storage electrode layer by residual transparent conductive material; and C: Manufacturing a source electrode layer, a drain electrode layer, and a conducting channel of the TFT.

2. The method for manufacturing the array substrate of claim 1, wherein the step C comprises the following steps:

C1: Coating a metal conducting layer on the surface of the array substrate to cover the transparent electrode layer and the n+a-Si layer;

C2: Coating the photoresist on the surface of the metal conducting layer, forming a source electrode pattern and a drain electrode pattern of the TFT by exposure and development, and covering one end of the transparent electrode layer by the drain electrode pattern;

C3: Etching the metal conducting layer to form the source electrode layer and the drain electrode layer of the TFT;

C4: Completely etching exposed n+a-Si layer material between the source electrode layer and the drain electrode layer to form the conducting channel; and C5: Coating a protective layer on the surface of the source electrode layer, the drain electrode layer, the conducting channel, and the transparent electrode layer.

3. The method for manufacturing the array substrate of claim 1, wherein the transparent electrode layer is made of indium tin oxide.

4. A method for manufacturing an array substrate, comprising: the following steps:

A: Forming a gate electrode layer and a storage electrode layer of a thin film transistor (TFT) on a glass substrate, and coating an insulating layer on the gate electrode layer and the storage electrode layer;

B1: Coating a transparent conducting material on the insulating layer;

B2: Coating a photoresist on the transparent conductive material, and forming a transparent electrode pattern by exposure and development;

B3: Etching transparent conducting material outside the transparent electrode pattern;

B4: Coating an a-Si layer and an n+a-Si layer on surfaces of the transparent electrode pattern by using a residual photoresist as a shelter and the insulating layer in sequence; and B5: Stripping residual photoresist, and forming the transparent electrode layer by exposed transparent conductive material; and C: Manufacturing a source electrode layer, a drain electrode layer, and a conducting channel of the TFT.

5. The method for manufacturing the array substrate of claim 4, wherein the step C comprises the following steps:

C1: Coating a metal conducting layer on the surface of the array substrate to cover the transparent electrode layer and the n+a-Si layer;

C2: Coating the photoresist on the surface of the metal conducting layer, forming a source electrode pattern and a drain electrode pattern of the TFT by exposure and development, and covering one end of the transparent electrode layer by the drain electrode pattern;

C3: Etching the metal conducting layer to form the source electrode layer and the drain electrode layer of the TFT;

C4: Completely etching exposed n+a-Si layer material between the source electrode layer and the drain electrode layer to form the conducting channel; and C5: Coating a protective layer on surfaces of the source electrode layer, the drain electrode layer, the conducting channel, and the transparent electrode layer.

* * * * *